(12) United States Patent
Park et al.

(10) Patent No.: US 11,355,570 B2
(45) Date of Patent: Jun. 7, 2022

(54) LIGHT EMITTING DISPLAY PANEL AND LIGHT EMITTING DISPLAY APPARATUS USING THE SAME

(71) Applicant: LG Display Co., Ltd., Seoul (KR)

(72) Inventors: NamKil Park, Paju-si (KR); JungChul Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/131,237

(22) Filed: Dec. 22, 2020

(65) Prior Publication Data

US 2021/0202638 A1 Jul. 1, 2021

(30) Foreign Application Priority Data

Dec. 31, 2019 (KR) .................. 10-2019-0180151

(51) Int. Cl.

| G09G 3/3266 | (2016.01) |
| H01L 27/32 | (2006.01) |
| H01L 27/15 | (2006.01) |
| G09G 3/3275 | (2016.01) |
| G09G 3/32 | (2016.01) |
| H01L 27/12 | (2006.01) |

(52) U.S. Cl.
CPC ....... H01L 27/3262 (2013.01); G09G 3/3266 (2013.01); G09G 3/3275 (2013.01); H01L 27/156 (2013.01); H01L 27/3276 (2013.01); G09G 3/32 (2013.01); H01L 27/1214 (2013.01)

(58) Field of Classification Search
CPC ................ G09G 3/3266; G09G 3/3275; H01L 27/3276; H01L 27/156
See application file for complete search history.

(56) References Cited

U.S. PATENT DOCUMENTS

| 2009/0184946 A1* | 7/2009 | Ahn ..................... G09G 3/3225 345/206 |
| 2019/0027096 A1* | 1/2019 | Kim ..................... G09G 3/3266 |
| 2020/0185638 A1* | 6/2020 | Choi ................... H01L 27/3276 |

* cited by examiner

*Primary Examiner* — Kent W Chang
*Assistant Examiner* — Scott D Au
(74) *Attorney, Agent, or Firm* — Birch, Stewart, Kolasch & Birch, LLP

(57) ABSTRACT

A light emitting display panel and a light emitting display apparatus using the same are disclosed, in which a gate driver is built in a display area and a low voltage supply line is provided in a non-display area. Each pixel in the display area includes a light emitting diode and a pixel driving circuit for driving the light emitting diode. The light emitting diode is connected with a high voltage line to which a first driving voltage is supplied, and is connected with a display area low voltage supply line to which a second driving voltage is supplied.

6 Claims, 6 Drawing Sheets

LIGHT EMITTING DISPLAY PANEL AND LIGHT EMITTING DISPLAY APPARATUS USING THE SAME

CROSS-REFERENCE TO RELATED APPLICATIONS

This application claims the benefit of priority to Korean Patent Application No. 10-2019-0180151, filed on Dec. 31, 2019 in the Republic of Korea, the entire contents of which are hereby expressly incorporated by reference into the present application.

BACKGROUND

Technical Field

The present disclosure relates to a light emitting display panel and a light emitting display apparatus using the same.

Description of the Related Art

A light emitting display apparatus is a display apparatus using a light emitting diode that self-emits light.

The light emitting display apparatus does not need a separate light source unlike a liquid crystal display (LCD) apparatus, and thus can be manufactured into a lightweight and thin form. Further, the organic light emitting display apparatus is advantageous in terms of power consumption since it is driven with a low voltage.

Recently, in addition to the technology for improving image quality and display quality of the light emitting display apparatus, technologies for enlarging a display area relatively by downsizing a bezel (non-display area) of the light emitting display apparatus have been suggested.

For example, a gate in panel (GIP) system in which a gate driver is directly built in a non-display area of a light emitting display panel is one of the technologies suggested as above.

However, since there is limitation in downsizing the size of the non-display area in accordance with the gate in panel system, a new technology is needed to further downsize a width of the non-display area.

BRIEF SUMMARY OF THE DISCLOSURE

The present disclosure has been made in view of the above problems and other limitations associated with the related art, and it is an object of the present disclosure to provide a light emitting display panel and a light emitting display apparatus using the same, in which a gate driver is built in a display area and a low voltage supply line is provided in a non-display area.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a light emitting display panel comprising a display area onto which an image is output, provided with pixels, gate lines and data lines, and a non-display area onto which an image is not output, surrounding the display area, wherein each of the pixels includes a light emitting diode and a pixel driving circuit for driving the light emitting diode, the light emitting diode is connected with a high voltage line to which a first driving voltage is supplied, and a display area low voltage supply line to which a second driving voltage is supplied, the display area is provided with a gate driver outputting gate signals to the gate lines, and the non-display area is provided with a low voltage supply line connected with the display area low voltage supply line.

In accordance with another aspect of the present disclosure, the above and other objects can be accomplished by the provision of a light emitting display apparatus comprising the light emitting display panel, a data driver supplying data voltages to the data lines, and a controller controlling functions of the gate driver and the data driver.

According to the present disclosure, since the gate driver is disposed in the display area, reliability of the gate driver can be maintained in the same manner as the light emitting display apparatus of the related art. Since minimum lines such as low voltage supply lines are disposed in the non-display area, a narrow bezel can be obtained.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

In giving reference numerals to elements of each drawing in the present disclosure, wherever possible, the same reference numbers will be used throughout the drawings to refer to the same or like parts.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a time relationship, for example, when the temporal order is described as 'after-', 'subsequent-', 'next-', and 'before-', a case which is not continuous can be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. can be used herein to describe various elements, these elements should not be limited by these terms. These terms are only used to distinguish one element from another and may not define any order. For example, a first element could be termed a second element, and, similarly, a second element could be termed a first element, without departing from the scope of the present disclosure.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, an example of a light emitting display apparatus according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 1:
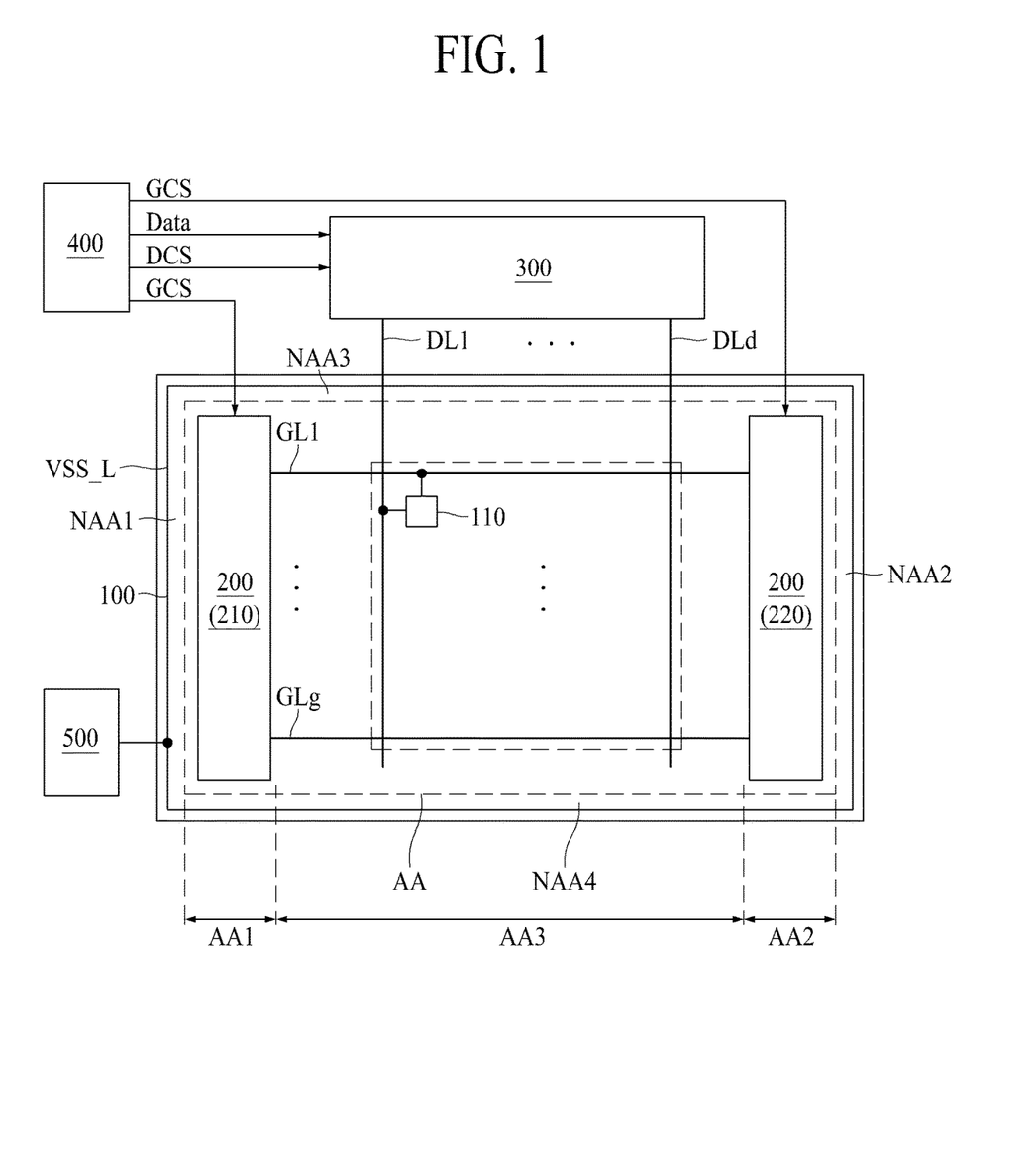
FIG. 1 is an exemplary view illustrating a light emitting display apparatus according to one or more embodiments of the present disclosure.
Figure 2:
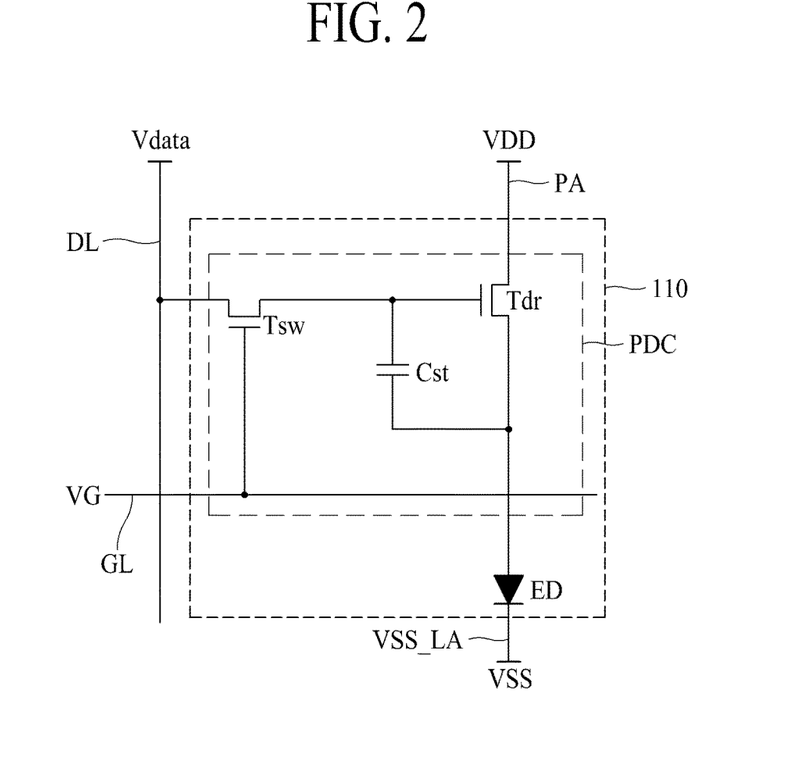
FIG. 2 is an exemplary view illustrating an example of a pixel provided in a light emitting display apparatus according to the present disclosure.
Figure 3:
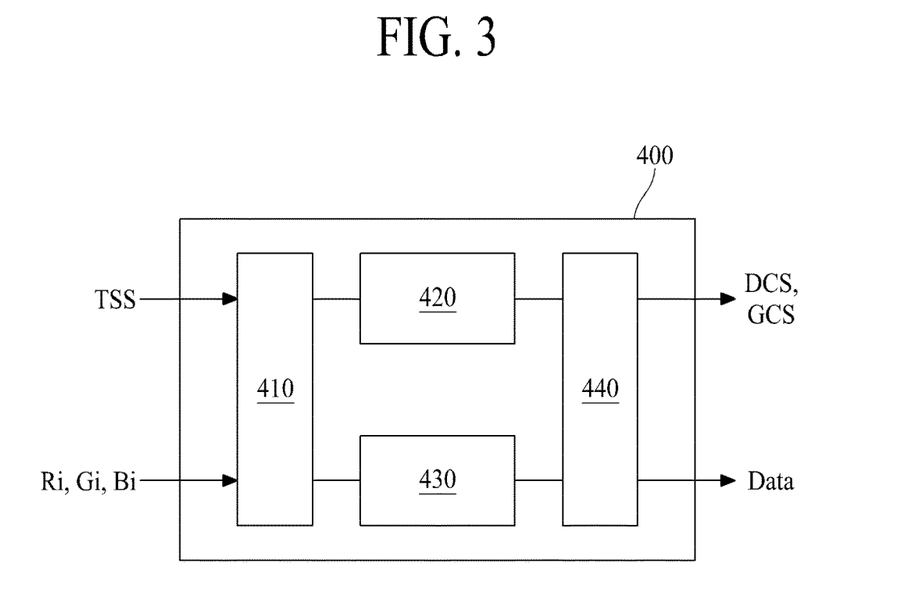
FIG. 3 is an exemplary view illustrating an example of a controller applied to a light emitting display apparatus according to the present disclosure.

FIG. 1 is an exemplary view illustrating a light emitting display apparatus according to the present disclosure, FIG. 2 is an exemplary view illustrating an example of a pixel provided in a light emitting display apparatus according to the present disclosure, and FIG. 3 is an exemplary view illustrating an example of a controller applied to a light emitting display apparatus according to the present disclosure. All the components of the light emitting display apparatus according to all embodiments of the present disclosure are operatively coupled and configured.

The light emitting display apparatus according to the present disclosure can include various electronic devices. The electronic device, for example, can be a smart phone, a tablet PC, a television, a monitor, etc.

The light emitting display apparatus according to the present disclosure, as shown in FIG. 1, includes a light emitting display panel 100 provided with gate lines GL1 to GLg and data lines DL1 to DLd, a gate driver 200 supplying gate signals to the gate lines GL1 to GLg, a data driver 300 supplying data voltages Vdata to the data lines DL1 to DLd, and a controller 400 for controlling functions of the gate driver 200 and the data driver 300, where d and g are positive numbers such as positive integers.

The light emitting display panel 100 includes a display area AA which outputs an image, and a non-display area NAA surrounding the display area AA and which does not output an image.

The display area AA is provided with the gate lines GL1 to GLg and the data lines DL1 to DLd. Also, the display area AA is provided with the gate driver 200. The gate driver 200 can be provided at one side of the display area AA, for example, only a left side or right side of the light emitting display panel shown in FIG. 1, but can be provided at both sides of the light emitting display panel as shown in FIG. 1.

Hereinafter, for convenience of description, one side of the display area AA, for example, the left side of the light emitting display panel 100 shown in FIG. 1 will be referred to as a first display area AA1, and another side of the display area AA, for example, the right side of the light emitting display panel 100 shown in FIG. 1 will be referred to as a second display area AA2. For example, the first display area AA1 and the second display area AA2 face each other, and a third display area AA3 is provided between the first display area AA1 and the second display area AA2.

In this case, the gate driver provided in the first display area AA1 will be referred to as a first gate driver 210, and the gate driver provided in the second display area AA2 will be referred to as a second gate driver 220. Pixels 110 are provided in the display area AA.

The non-display area NAA can be disposed to adjoin the display area AA. For example, as shown in FIG. 1, the non-display area NAA surrounds the display area AA.

In the following description, the non-display area NAA, as shown in FIG. 1, can be categorized into a first non-display area NAA1 provided outside the first display area AA1, a second non-display area NAA2 provided outside the second display area AA2, a third non-display area NAA3 provided on an upper end of the first gate line GL1, and a fourth non-display area NAA4 provided on a lower end of the gth gate line GLg.

The non-display area NAA can be provided with a low voltage supply line VSS_L for transmitting a low voltage to be supplied to the pixels. The low voltage can be supplied through a power supply 500. The low voltage supply line VSS_L, as shown in FIG. 1, can be provided in all of the first non-display area NAA1 to the fourth non-display area NAA4 but can be provided in some of the first non-display area NAA1 to the fourth non-display area NAA4. Particularly, the low voltage supply line VSS_L can be provided in only the first non-display area NAA1 and the second non-display area NAA2.

Each pixel 110 provided in the light emitting display panel 100, as shown in FIG. 2, can include a light emitting diode ED, and a pixel driving circuit PDC for driving the light emitting diode ED. The pixel driving circuit PDC can include a switching transistor Tsw, a capacitor Cst, and a driving transistor Tdr. However, the pixel driving circuit PDC shown in FIG. 2 can be changed in various structures. For example, the pixel driving circuit PDC can further include at least one transistor for internal compensation or external compensation.

In this case, the internal compensation means a method for controlling a voltage of a gate of the driving transistor Tdr such that a current supplied to the light emitting diode ED is not affected by a change of a threshold voltage or mobility of the driving transistor Tdr even though the threshold voltage or mobility of the driving transistor Tdr is changed by degradation of the driving transistor Tdr.

The external compensation means a method for changing a size of a data voltage Vdata supplied to a data line DL in accordance with the amount of change of the threshold voltage or mobility of the driving transistor Tdr due to degradation of the driving transistor Tdr.

The light emitting diode can include an anode connected with the driving transistor Tdr, a light emitting layer provided on the anode, and a cathode provided on the light emitting layer.

The light emitting layer can include any one of an organic light emitting layer, an inorganic light emitting layer, and a quantum dot light emitting layer, or can include a deposited or mixed structure of an organic light emitting layer (or inorganic light emitting layer) and a quantum dot light emitting layer.

Semiconductor layers constituting the switching transistor Tsw, the driving transistor Tdr, and another transistors provided in the pixel 110 can be formed of any one of polycrystalline polysilicon, amorphous oxide, crystalline oxide, and amorphous silicon.

The driving transistor Tdr is connected between the light emitting diode ED and a high voltage line PA to which a first driving voltage VDD is supplied. The light emitting diode ED is connected between a display area low voltage supply line VSS_LA to which a second voltage VSS is supplied, and the driving transistor Tdr.

The first driving voltage VDD can be a high voltage, and the second driving voltage VSS can be a low voltage lower than the first driving voltage VDD. For example, the light emitting diode ED is provided between the high voltage line PA and the display area low voltage supply line VSS_LA.

The display area low voltage supply line VSS_LA to which the second driving voltage VSS is supplied is connected with the low voltage supply line VSS_L provided in the non-display area NAA. For example, the low voltage supplied from the power supply 500 is supplied to the display area low voltage supply line VSS_LA provided in the display area through the low voltage supply line VSS_L provided in the non-display area NAA.

Signal lines for defining a pixel area in which the pixels 110 are formed and supplying a driving signal to the pixel driving circuit provided in the pixel 110 are formed in the light emitting display panel 100.

The signal lines can include various types of lines in addition to the gate lines GL1 to GLg, the data lines DL1 to DLd, the low voltage supply line VSS_L, and the display area low voltage supply line VSS_LA.

The data driver 300 can be provided in a chip on film attached onto the display panel 100. The chip on film is also connected to a main board provided with the controller 400. In this case, the chip on film is provided with lines electrically connecting the controller 400, the data driver 300 and the display panel 100 with one another. To this end, the lines are electrically connected with pads provided in the display panel 100 and the main board.

The main board is electrically connected with an external substrate in which the external system is provided. The data driver 300 can electrically be connected with the main board after being directly provided in the display panel 100.

However, the data driver 300 can be formed as one integrated circuit together with the controller 400, and the integrated circuit can be provided in the chip one film, or can directly be provided in the display panel 100.

The external system performs a function of driving the controller 400 and the electronic device. For example, if the electronic device is a smart phone, the external system generates various kinds of audio information, video information and text information through a wireless communication network and transmits the video information to the controller 400. The video information can be the input image data.

The controller 400, as shown in FIG. 3, includes a data alignment unit 430 for realigning input image data Ri, Gi and Bi transmitted from the external system by using a timing synchronization signal TSS transmitted from the external system and supplying the realigned image data Data to the data driver 300, a control signal generator 420 for generating a gate control signal GCS and a data control signal DCS by using the timing synchronization signal TSS, an input unit 410 for receiving the timing synchronization signal TSS and the image data Ri, Gi and Bi transmitted from the external system and transmitting the input image data Ri, Gi and Bi to the data alignment unit 430 and the control signal generator 420, and an output unit 440 for outputting the image data Data generated by the data alignment unit 430 and the control signals DCS and GCS generated by the control signal generator 420 to the data driver 300 or the gate driver 200.

The gate driver 200 supplies the gate signals to the gate lines GL1 to GLg. Hereinafter, a structure and functions of the gate driver 200 will be described with reference to FIGS. 4 and 5.

Figure 4:
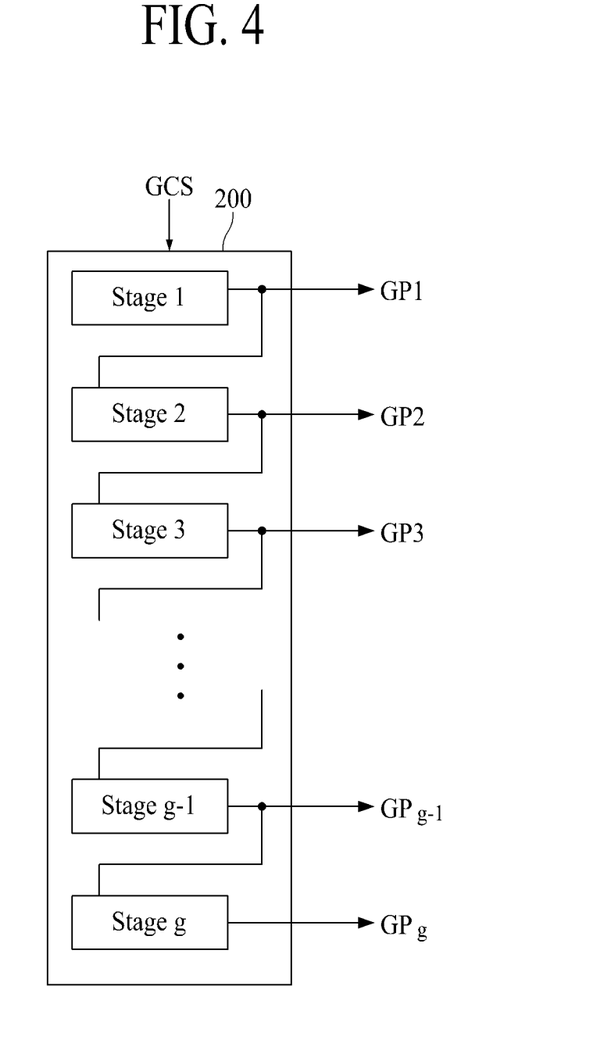
FIG. 4 is an exemplary view illustrating an example of a structure of a gate driver provided in a light emitting display panel according to the present disclosure.
Figure 5:
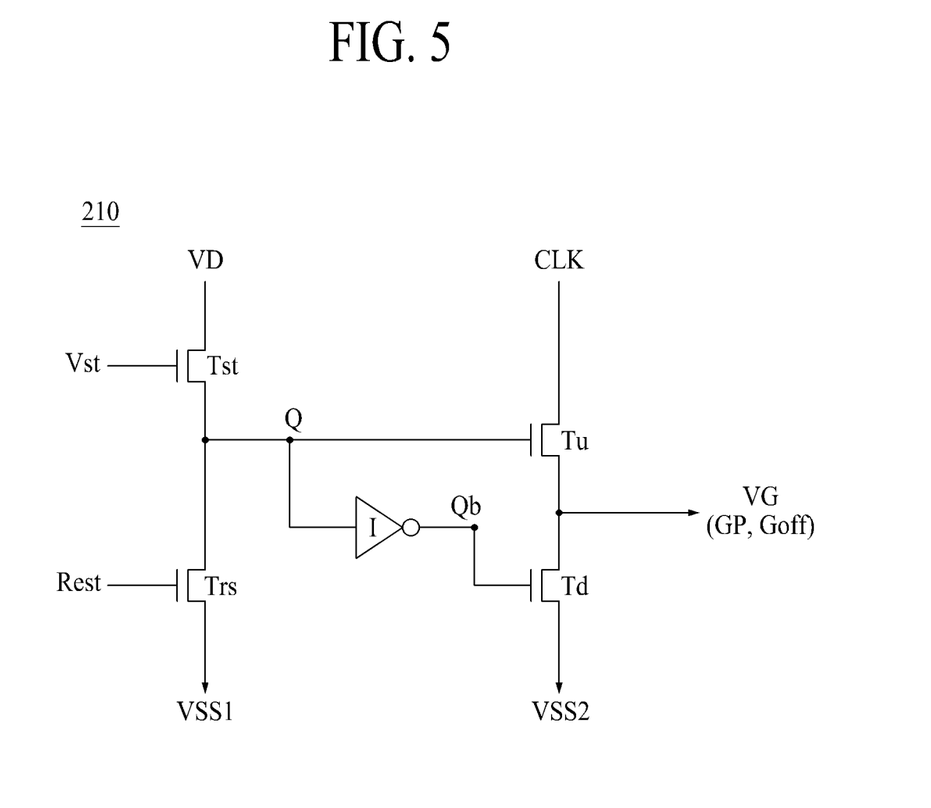
FIG. 5 is an exemplary view illustrating an example of a basic structure of a stage shown in FIG. 4.

FIG. 4 is an exemplary view illustrating an example of a structure of a gate driver provided in a light emitting display panel according to the present disclosure, and FIG. 5 is an exemplary view illustrating an example of a basic structure of a stage shown in FIG. 4.

Particularly, the gate driver 200 shown in FIG. 4 can be the first gate driver 210 or the second gate driver 220. For example, the first gate driver 210 and the second gate driver 220 can have structures and functions the same as or similar to each other.

For example, the first gate driver 210 and the second gate driver 220 can simultaneously output gate pulses to the same gate lines, and can output the gate pulses to different gate lines. In case of the former case, the first gate driver 210 and the second gate driver 220 can perform the same structure and the same function. In case of the latter case, the first gate driver 210 and the second gate driver 220 can output the gate pulses at different timings but perform the same structure and the same function.

The gate driver 200 is provided in the display area AA. Particularly, the first gate driver 210 is provided in the first display area AA1, and the second gate driver 220 is provided in the second display area AA2.

The gate pulse GP output from the gate driver 200 turns on the switching transistor Tsw shown in FIG. 2, and a gate off signal Goff output from the gate driver 200 turns off the switching transistor Tsw. The gate pulse GP and the gate off signal Goff will collectively be referred to as a gate signal.

The gate driver 200, as shown in FIG. 4, includes stages Stage 1 to Stage g supplying gate pulses GP1 to GPg to the gate lines GL1 to GLg connected with the pixels.

Each of the stages Stage 1 to Stage G includes a plurality of transistors. FIG. 5 shows a stage provided with four transistors Tst, Trs, Tu, and Td as an example of the stage which can be used as each of one or more of the stages in FIG. 4.

For example, the start transistor Tst is turned on by a start signal to supply a first voltage VD which is a high voltage, to a gate of a pull-up transistor Tu through Q node Q. The pull-up transistor Tu is turned on by the first voltage VD and outputs a gate clock CLK to the gate line GL. In this case, the gate pulse GP having a high value is output to the gate line. The gate clock CLK is one of the gate control signal CGS. For example, the gate control signal GCS can include at least one gate clock GLK and various signals, for example, a gate start signal, etc.

The first voltage VD that has passed through the start transistor Tst is converted to a low voltage by an inverter I and then supplied to the gate of the pull-down transistor Td through a Qb node Qb. Therefore, the pull-down transistor Td is turned off.

If the start transistor Tst is turned off and a reset transistor Trs is turned on by a reset signal Rest, a second voltage VSS1 which is a low voltage is supplied to the pull-up transistor Tu through the reset transistor Trs. Therefore, the pull-up transistor Tu is turned off.

The second voltage VSS1 is converted to a high voltage by the inverter I and then supplied to the gate of the pull-down transistor Td through the Qb node Qb. Therefore, the pull-down transistor Td is turned on. In this case, a third voltage VSS2 which is a low voltage is supplied to the gate line GL through the pull-down transistor Td. The third voltage VSS2 supplied to the gate line through the pull-down transistor Td is a gate off signal Goff. The second voltage VSS1 and the third voltage VSS2 can be equal to or different from each other.

When the gate pulse GP is supplied to the gate of the switching transistor Tsw provided in the pixel 110, the switching transistor Tsw is turned on, whereby an image can be output from the pixel. When the gate off signal Goff is supplied to the switching transistor Tsw, the switching transistor Tsw is turned off, whereby an image is not output from the pixel.

The structure and function of the stage can be changed in various ways in addition to the structure and function described in FIGS. 4 and 5. Therefore, the stage can further be provided with another stages in addition to the transistors Tst, Trs, Tu and Td.

Semiconductor layers constituting the transistors provided in the stage can be formed of any one of polycrystalline polysilicon, amorphous oxide, crystalline oxide, and amorphous silicon.

In this case, the semiconductor layers that form the transistors constituting the stage and the semiconductor layers that form the transistors provided in the pixels 110 can be formed of the same material, but can be formed of their respective materials different from each other.

For example, the transistors provided in the pixels 110 can be formed of polycrystalline polysilicon, while the transistors constituting the stage can be formed of amorphous oxide or crystalline oxide. Also, the transistors provided in the pixels 110 can be formed of polycrystalline polysilicon, while the transistors constituting the stage can be formed of amorphous silicon. Also, the transistors provided in the pixels 110 can be formed of amorphous oxide, while the transistors constituting the stage can be formed of polycrystalline thin film silicon.

Figure 6:
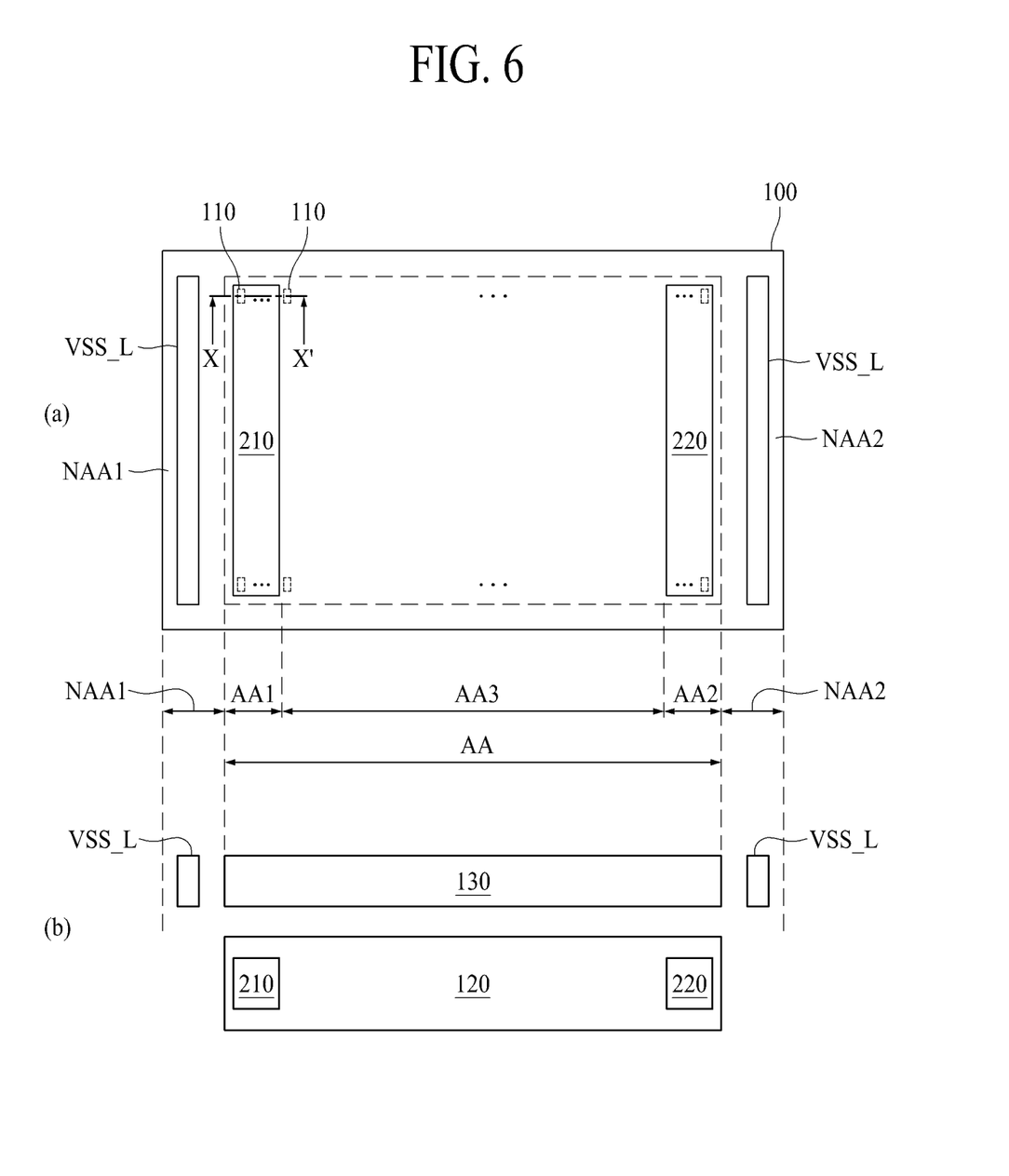
FIG. 6 is an exemplary view illustrating a plane and a section of a light emitting display panel according to one or more embodiments of the present disclosure.
Figure 7:
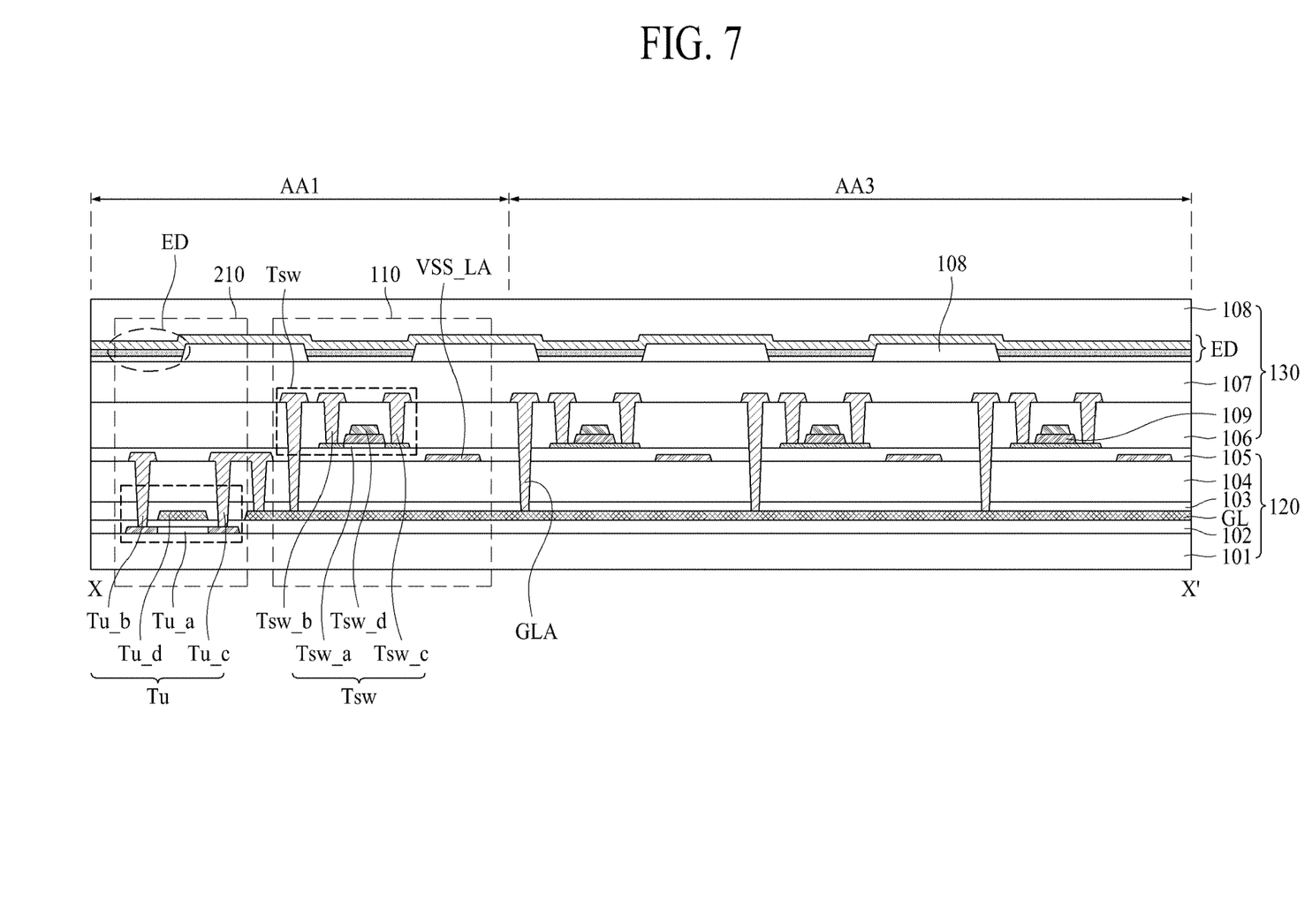
FIG. 7 is an exemplary view illustrating a sectional view taken along line X-X' shown in FIG. 6.

FIG. 6 is an exemplary view illustrating an example of a plane and a section of a light emitting display panel according to the present disclosure, and FIG. 7 is an exemplary view illustrating a sectional view taken along line X-X' shown in FIG. 6. For example, (a) of FIG. 6 is a plane view of the light emitting display panel 100, and (b) of FIG. 6 is a cross-sectional view of the light emitting display panel 100.

Referring to FIGS. 6 and 7, the light emitting display panel according to the present disclosure includes a display area AA onto which an image is output, and a non-display area NAA onto which an image is not output.

The first gate driver 210 is provided in the first display area AA1 of the display area AA, and the second gate driver 220 is provided in the second display area AA2 of the display area AA. The pixels 110 are provided in the display area AA.

The low voltage supply line VSS_L is provided in the first non-display area NAA1 and the second non-display area NAA2 of the non-display area NAA.

The light emitting display panel 100, as shown in FIGS. 6 and 7, includes a first panel layer 120 provided with the first gate driver 210 and the second gate driver 220, and a second panel layer 130 provided with pixel driving circuits PDCs constituting the pixels 110 and light emitting diodes ED.

Therefore, the display area AA can also include the first panel layer 120 and the second panel layer 130.

In the first display area AA1 and the second display area AA2 of the display area AA, the pixel driving circuits PDCs and the light emitting diodes EDs provided in the second panel layer 130 can be overlapped with the first gate driver 210 and the second gate driver 220 provided in the first panel layer 120. In this case, the pixel driving circuits PDCs and the light emitting diodes EDs can only be provided in the third display area AA3 provided between the first display area AA1 and the second display area AA2 of the display area AA.

For example, as shown in FIG. 7, the light emitting display panel 100 includes a first panel layer 120 provided with the first gate driver 210 and the second gate driver 220, and a second panel layer 130 provided with pixel driving circuits PDCs constituting the pixels 110 and light emitting diodes ED. For example, the second panel layer 130 is provided on the first panel layer 120.

The first panel layer 120 can include a base substrate 101, first and second gate drivers 210 and 220 provided on the base substrate 101, and a buffer layer 103 covering the first and second gate drivers 210 and 220.

The first gate driver 210 can include an active layer, a first gate insulating layer 102, a gate, a first passivation layer 103, and a first planarization layer 104, which are provided on the base substrate 101.

The second panel layer 130 can include a display area low voltage supply line VSS_LA provided on the first planarization layer 104, a second passivation layer 105 covering the display area low voltage supply line VSS_LA, transistors provided on the second passivation layer 105, a second planarization layer 107 covering the transistors, a light emitting diode ED and a buffer layer 108, which are provided on the second planarization layer, and an encapsulation layer 108 covering the light emitting diode ED. The transistors can be the switching transistor Tsw and the driving transistor Tdr as shown in FIG. 3. Each of the transistors can include at least one insulating layer 106, a semiconductor layer, and a gate. The display area low voltage supply line VSS_LA and the second passivation layer 105 can be included in the first panel layer 120.

In this case, one pull-up transistor Ts constituting the first gate driver 210 is only provided in the first display area AA1 of the first panel layer 120 shown in FIG. 7, but a plurality of transistors included in the stages constituting the first gate driver 210 can be provided in the first display area AA1 of the first panel layer 120. In this case, the pull-up transistor Tu can be turned on by the first voltage VD and serve to output the gate pulse GP to the gate line GL as described with reference to FIG. 5. The pull-up transistor Tu, as shown in FIG. 7, can include a first semiconductor layer Tu_a, a first terminal Tu_b provided at one side of the first semiconductor layer Tu_a, a second terminal Tu_c provided at the other side of the first semiconductor layer Tu_a, and a first gate Tu_d provided to overlap the first semiconductor layer Tu_b by interposing the first gate insulating layer 102. For example, the gate clock CLK can be supplied to the first terminal Tub as shown in FIG. 5. The second terminal Tu_c can be connected with the gate line GL, and the first gate node Tu_d can be connected with the Q node Q. The first semiconductor layer Tu_a constituting the pull-up transistor Tu can be formed of, but not limited to, polycrystalline silicon, and can be formed of various types of semiconductors as described above.

Also, although FIG. 7 shows that one switching transistor Tsw is only provided in the first display area AA1 of the first panel layer 120, a plurality of pixels 110 can be provided in the first area AA1 of the first panel layer 120. For example, a plurality of switching transistors Tsw, a plurality of pull-up transistors Tu and a plurality of pull-down transistors Td can be provided in the first display area AA1 of the first panel layer 120. In this case, the switching transistor Tsw, as described with reference to FIG. 2, can be turned on by the gate pulse GP to serve to transmit the data voltage Vdata supplied through the data line DL to the gate of the driving transistor Tdr. The switching transistor Tsw, as shown in FIG. 7, can include a second semiconductor layer Tsw_a, a third terminal Tsw_b provided at one side of the second semiconductor layer Tsw_a, a fourth terminal Tsw_c provided at the other side of the second semiconductor layer Tsw_a, and a second gate Tsw_d provided to overlap the second semiconductor layer Tsw_a by interposing the second gate insulating layer 109. For example, the third terminal Tsw_b, as shown in FIG. 2, can be connected with the data line DL, the fourth terminal Tsw_c can be connected with the gate of the driving transistor Tdr, and the second gate Tsw_d can be connected with the gate line GL. The second semiconductor layer Tsw_a constituting the switching transistor Tsw can be, but not limited to, an oxide semiconductor, and can be formed of various types of semiconductors as described above.

The second semiconductor layer Tsw_a of the switching transistor Tsw and the semiconductor layer of the driving transistor Tdr can include the same semiconductor. The first semiconductor layer Tu_a of the pull-up transistor Tu can include a semiconductor different from those of the second semiconductor layer Tsw_a of the switching transistor Tsw and the semiconductor layer of the driving transistor Tdr. For example, the first semiconductor layer Tu_a of the pull-up transistor Tu can include polycrystalline silicon semiconductor, and the second semiconductor layer Tsw_a of the switching transistor Tsw and the semiconductor layer of the driving transistor Tdr can include oxide semiconductors.

Also, in the first display area AA1 and the second display area AA2, as shown in FIGS. 6 and 7, the light emitting diodes ED and the pixel driving circuits PDCs can be overlapped with the transistors constituting the first gate driver 210 and the second gate driver 220.

For example, the transistors provided in the first panel layer 120 and the transistors provided in the second panel layer 130 are only electrically connected with the gate line GL which will be described later, and thus can be formed to be overlapped with each other in various ways.

The gate line GL extended from the first gate driver 210, as shown in FIG. 7, can be extended to the second panel layer 130 through contact holes formed in the first passivation layer 103, the first planarization layer 104 and the insulating layer 106. The switching transistors Tsw provided in the pixels 110 extended along the gate line GL can be connected with the gate line GL through the contact holes.

For example, gate extension lines GLA extended from the gate line GL to the second panel layer 130 through the contact holes can be connected with the pixel driving circuits provided in the second panel layer 130, particularly the switching transistors Tsw.

As described above, the transistors constituting the first gate driver 210 and the second gate driver 220 are provided in the first panel layer 120, and the transistors constituting the pixel driving circuits PDCs are provided in the second panel layer 130.

Therefore, the semiconductor layers constituting the transistors provided in the first gate driver 210 and the second gate driver 220 are provided on a layer different from the semiconductor layers constituting the transistors provided in the pixel driving circuits PDCs.

The second panel layer 130 can be formed in various ways to be equal to or similar to the structure of the light emitting display panel which is generally used.

Particularly, as described above, among the transistors provided in the second panel layer 130, the transistors connected with the gate line GL, for example, the switching transistors Tsw can be connected with the gate line GL through the gate extension lines GLAs provided in the contact holes provided in the first panel layer 120 and the second panel layer 130.

The low voltage supply line VSS_L provided in the non-display area NAA outside the display area AA is connected with the display area low voltage supply lines VSS_LA provided in the display area AA.

In this case, the low voltage supply line VSS_L can be protected by being covered by the encapsulation layer 108.

According to the present disclosure as described above, the low voltage supply line VSS_L can be provided in the non-display area NAA, and the first gate driver 210 and the second gate driver 220 can be provided in the display area AA.

For example, the first gate driver 210 and the second gate driver 220 are not provided in the non-display area of the light emitting display panel according to the present disclosure.

Therefore, a width and an area of the non-display area NAA can be reduced as much as those of the first gate driver 210 and the second gate driver 220. Therefore, according to the present disclosure, the width and the area of the non-display area provided at the outermost of the light emitting display panel 100 can be reduced, whereby a narrow bezel can be embodied.

The aforementioned features of the present disclosure can be summarized as follows.

The light emitting display panel according to to one or more embodiments of the present disclosure comprises a display area onto which an image is output, provided with pixels, gate lines and data lines, and a non-display area onto which an image is not output, surrounding the display area, wherein each of the pixels includes a light emitting diode and a pixel driving circuit for driving the light emitting diode, the light emitting diode is connected with a high voltage line, to which a first driving voltage is supplied, and a display area low voltage supply line to which a second driving voltage is supplied, the display area is provided with a gate driver outputting gate signals to the gate lines, and the non-display area is provided with a low voltage supply line connected with the display area low voltage supply line.

The display area includes a first display area provided with a first gate driver constituting the gate driver, a second display area provided with a second gate driver constituting the gate driver, and a third display area provided between the first display area and the second display area.

Transistors constituting the pixel driving circuit and transistors constituting the gate driver are provided on their respective layers different from each other.

The display area includes a first panel layer provided with the transistors constituting the gate driver, and a second panel layer provided with the light emitting diode and the transistors constituting the pixel driving circuit, wherein the second panel layer is provided on the first panel layer.

The gate line connected with the gate driver is connected with the pixel driving circuit provided in the pixels provided along the gate line through gate extension lines provided in the first panel layer and the second panel layer.

Semiconductor layers that form the transistors constituting the gate driver and semiconductor layers that form the transistors constituting the pixel driving circuit can be formed of their respective materials different from each other.

The transistors constituting the gate driver are overlapped with the pixel driving circuits and the light emitting diodes in the first display area and the second display area, and the pixel driving circuits and the light emitting diodes are provided in the third display area.

The light emitting display apparatus according to the present disclosure comprises the light emitting display panel, a data driver supplying data voltages to the data lines, and a controller controlling functions of the gate driver and the data driver.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light emitting display panel comprising:
a display area configured to output an image, and provided with pixels, gate lines and data lines; and
a non-display area configured to not output an image, and surrounding the display area,
wherein each of the pixels includes a light emitting diode and a pixel driving circuit for driving the light emitting diode,
the light emitting diode is connected with a high voltage line to which a first driving voltage is supplied, and is connected with a display area low voltage supply line to which a second driving voltage is supplied,
the display area is provided with a gate driver configured to output gate signals to the gate lines, and
the non-display area is provided with a low voltage supply line connected with the display area low voltage supply line,
wherein the display area includes:
a first panel layer provided with transistors constituting the gate driver; and
a second panel layer provided with the light emitting diode and transistors constituting the pixel driving circuit, the second panel layer being provided on the first panel layer,
wherein a gate line among the gate lines is provided in the first panel layer, and is connected with the pixel driving circuit provided in the pixels provided along the gate line through gate extension lines provided in contact holes provided in the first panel layer and the second panel layer, and
wherein the display area low voltage supply line is provided between the first panel layer and the second panel layer.

2. The light emitting display panel of claim 1, wherein the display area includes:
a first display area provided with a first gate driver constituting the gate driver;
a second display area provided with a second gate driver constituting the gate driver; and
a third display area provided between the first display area and the second display area.

3. The light emitting display panel of claim 2, wherein the transistors constituting the gate driver are overlapped with pixel driving circuits and light emitting diodes in the first display area and the second display area, and
the pixel driving circuits and the light emitting diodes are provided in the third display area.

4. The light emitting display panel of claim 1, wherein the transistors constituting the pixel driving circuit and the transistors constituting the gate driver are provided on their respective layers different from each other.

5. The light emitting display panel of claim 4, wherein semiconductor layers that form the transistors constituting the gate driver and semiconductor layers that form the transistors constituting the pixel driving circuit are formed of their respective materials different from each other.

6. A light emitting display apparatus comprising:
the light emitting display panel of claim 1;
a data driver configured to supply data voltages to the data lines; and
a controller configured to control functions of the gate driver and the data driver.

\* \* \* \* \*